United States Patent [15] 3,639,859
Zwlisen [45] Feb. 1, 1972

[54] OSCILLATOR HAVING SINGLE PARAMETER TUNING MEANS

[72] Inventor: Wilhelmus Antonius Joseph Marie Zwlisen, Emmasingel, Eindhoven, Netherlands

[73] Assignee: U.S. Philips Corporation, New York, N.Y.

[22] Filed: Aug. 28, 1969

[21] Appl. No.: 853,884

[30] Foreign Application Priority Data

Sept. 2, 1968 Netherlands ..........................6812495

[52] U.S. Cl. ..........................331/108 B, 331/135, 331/136, 328/128

[51] Int. Cl. ..........................H03b 5/24

[58] Field of Search ..............331/108.4, 135, 136; 328/127, 328/128

[56] References Cited

UNITED STATES PATENTS 3,146,407 8/1964 Crist ..........................331/136

OTHER PUBLICATIONS

Holt, IEEE Proc. June 1967, Vol. 55, No. 6 Pg. 1,119

*Primary Examiner*—John Kominski
*Attorney*—Frank R. Trifari

[57] ABSTRACT

An oscillator having a first phase-shifting network, an inverting amplifier and a second phase-shifting network comprising two impedances; one of the impedances is externally adjustable and determines the frequency of the oscillator signal. A total phase shift of 180° is achieved by means of the first phase-shifting network which provides a phase shift of substantially 90° in a frequency independent manner and by the second phase-shifting network which provides an additional phase shift of substantially 90° in a frequency-dependent manner.

6 Claims, 9 Drawing Figures

9

INVENTOR.
WILHELMUS A.J.M. ZWIJSEN
BY
Frank R. Trifari
AGENT

INVENTOR.
WILHELMUS A.J.M. ZWIJSEN

BY

AGENT

AN OSCILLATOR HAVING SINGLE PARAMETER TUNING MEANS

The invention relates to an oscillator for producing a voltage at a frequency which depends upon one variable impedance, which oscillator comprises a first phase-shifting network, at least one amplifier, a phase inverter including a second phase-shifting network and a feedback loop for maintaining the oscillator signal.

Such an oscillator is known from the French Pat. No. 1,015,580.

This known oscillator also includes amplifiers, two phase-shifting networks and a feedback loop, each phase-shifting network comprising the series connection of a resistor $R_1$ or $R_2$ and a capacitor $C_1$ or $C_2$, respectively. In its passage through these networks the oscillator signal is successively shifted so as to produce a total phase shift of 180°, so that the relationship $\omega^2 RR_1C_1 \cdot R_{22}=1$ is satisfied, where $\omega$ is the angular frequency of the signal generated.

The known oscillator has the disadvantage that two impedances ($R_1$ and $R_2$) are to be simultaneously controlled in the same ratio in order to achieve a proportional relationship with the period of the oscillation or to enable a large frequency range to be encompassed with a comparatively small resistance variation. Oscillators are also known in which in addition to the externally adjustable impedance a second impedance of the frequency-determining networks is adjusted by means of a control system to obtain a linear relationship between the period or the frequency and the first-mentioned impedance.

This latter type of oscillator has the disadvantage that the control system renders the oscillator expensive and complicated.

It is an object of the invention to obviate the said disadvantages and the invention has the advantage that it enables a measuring quantity, such as a resistance, a capacitance or an inductance, to be linearly converted into the period or the frequency of an oscillator signal. Especially in those cases in which a measuring value transducer is arranged in an inaccessible space having a high disturbance level, the conversion, either in direct or inverse proportion, of the measuring quantity into a frequency is highly useful, because a frequency signal can be reliably transmitted and digitally measured.

For this purpose, according to the invention an oscillator of the type described in the first paragraph is characterized in that the first phase-shifting network shifts the oscillator signal substantially 90° in phase irrespective of the frequency, and the second phase-shifting network, which comprises the series connection of a resistance and a reactance, in conjunction with the phase-inverter also shifts the oscillator signal substantially 90° in phase, depending on the frequency and on the values of the said impedances, one of these impedances being variable and its value being indirect or inverse proportion to the period.

Features and advantages of the invention will appear from the following description or the embodiments thereof, given by way of example only, with reference to the accompanying drawings, in which.

Figure 1:
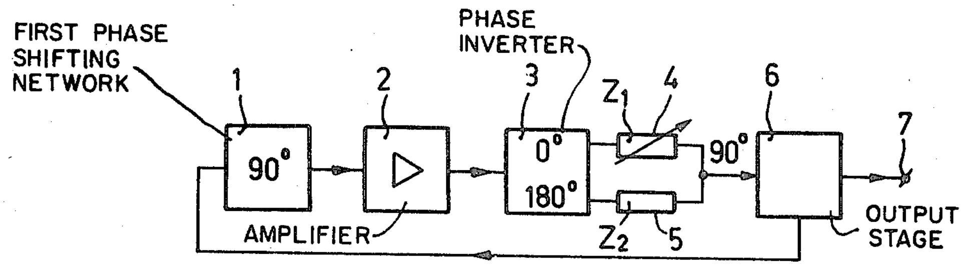
FIG. 1 is a block-schematic diagram of an oscillator according to the invention.

Referring to FIG. 1, the most important elements from which the oscillator according to the invention is composed are shown in the form of blocks.

A block 1 represents the first phase-shifting network. The circulating oscillator signal is shifted substantially 90° in phase in its passage through this network, irrespective of the frequency of the signal. A block 2 represents an amplifier which may have an amplitude control function or may be combined with the block 1. A block 3 is a device which may be provided with a feedback amplifier and has the function of supplying an oscillator signal of 0° and 180° phase shift to series connection of two impedances $Z_1$ and $Z_2$, which in FIG. 1 are designated by 4 and 5 respectively, one of these impedances being a resistance and the other being a reactance, for example a capacitance or an inductance.

The condition necessary for sustained oscillation is that the oscillator signal appearing at the junction of the impedances $Z_1$ and $Z_2$ is shifted 90° in phase with respect to the oscillator signal at the input of the phase inverter 3. Assuming the amplitude of the 0° and 180° signals to be equal, which is not absolutely necessary, the condition for obtaining the signal shifted 90° in phase is: $\omega C_R$ when $Z_1$ or $Z_2 = R$ and $Z_2 = \omega L$, or $\omega RC=1$ when $Z_2$ or $Z_1 = 1/\omega C$. From this it can be concluded that the following combinations are possible:

- the frequency depends linearly on the variable resistance $R$ with constant inductance,
- the period depends linearly on the variable inductance with constant $R$,
- the period depends linearly on the variable resistance with constant capacitance,
- the period depends linearly on the variable capacitance with constant resistance.

The block 6 of FIG. 1 represents an output stage provided with facilities for power amplification, for isolating the output 7 of the oscillator from the frequency-sensitive part, and for feedback, possibly combined with a phase shift of 180°. The block 6 may further include an amplitude control function so that the output signal at 7 is constant in amplitude and the amplitude requirement of the condition necessary for sustaining oscillation is always satisfied.

Figures 2, 3, 4, 5:
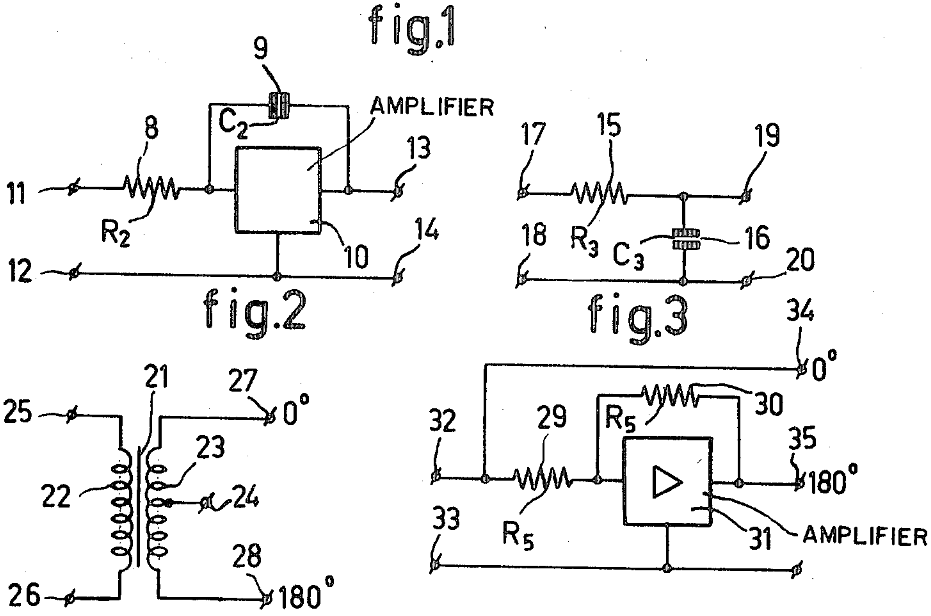
FIG. 2 is an embodiment of the first phase-shifting network together with an amplifier.
FIG. 3 shows another embodiment of the first phase-shifting network.
FIG. 4 shows an embodiment of the phase-inverter.
FIG. 5 shows a phase-inverter comprising resistors and amplifier.

FIG. 3 shows a first phase-shifting network 1 comprising a series resistor 15 and a parallel capacitor 16. On condition that $\omega R_3C_3$ is many times greater than unity there is produced at terminals 19 and 20 a signal which is shifted substantially 90° with respect to the signal at terminals 17 and 18 and has an amplitude which is $\omega R_3C_3$ times smaller.

It should be noted that the phase shift is −90°. The network 1 may advantageously be combined with the amplifier 2 to form a Miller integrator, as is shown in FIG. 2. An amplifier 10 is preceded by a series resistor 8 and is shunted by a capacitor 9. The signal at terminals 13 and 14 is shifted +90° with respect to the signal at terminals 11 and 12 and has an amplitude which is $\omega R_2C_2$ times smaller, while the condition that $\omega R_2C_2 \cdot A$ is much greater than unity must be satisfied, where A is the voltage amplification of the amplifier 10.

In FIG. 4, the phase inverter 3 comprises a transformer 21 having input terminals 25 and 26 for the oscillator signal and a primary winding 22. A secondary winding 23 is provided with a central tapping 24. At terminals 27 and 28 there will appear signals with respect to the tapping 24 which are in phase opposition.

Another embodiment of the phase inverter 3 of FIG. 1 is shown in FIG. 5. The input of an amplifier 31 is preceded by a series resistor 29 of value $R_5$, a resistor 30 of substantially equal value providing the feedback from the output to the input of the amplifier 31. The output voltage at the terminal 35 is shifted 180° in phase with respect to the input voltage at terminals 32 and 33.

Figure 6:
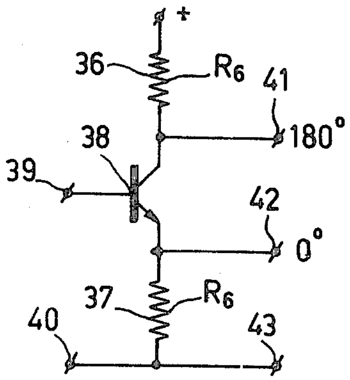
FIG. 6 shows a phase inverter comprising two resistors and a transistor.

In FIG. 6 the oscillator signal is applied through terminals 39 and 40 to the base of a transistor 38. The 0° signal is taken from the emitter resistor 37 through a terminal 42, and the 180° signal may be taken through terminal 41 from a collector resistor 36 having a value $R_6$ approximately equal to that of the emitter resistor 37.

Figure 7:
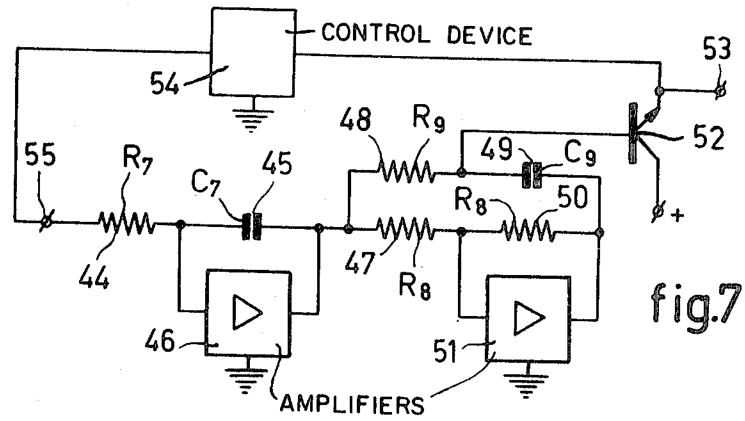
FIG. 7 shows a practical embodiment of the oscillator.
Figures 8, 9:
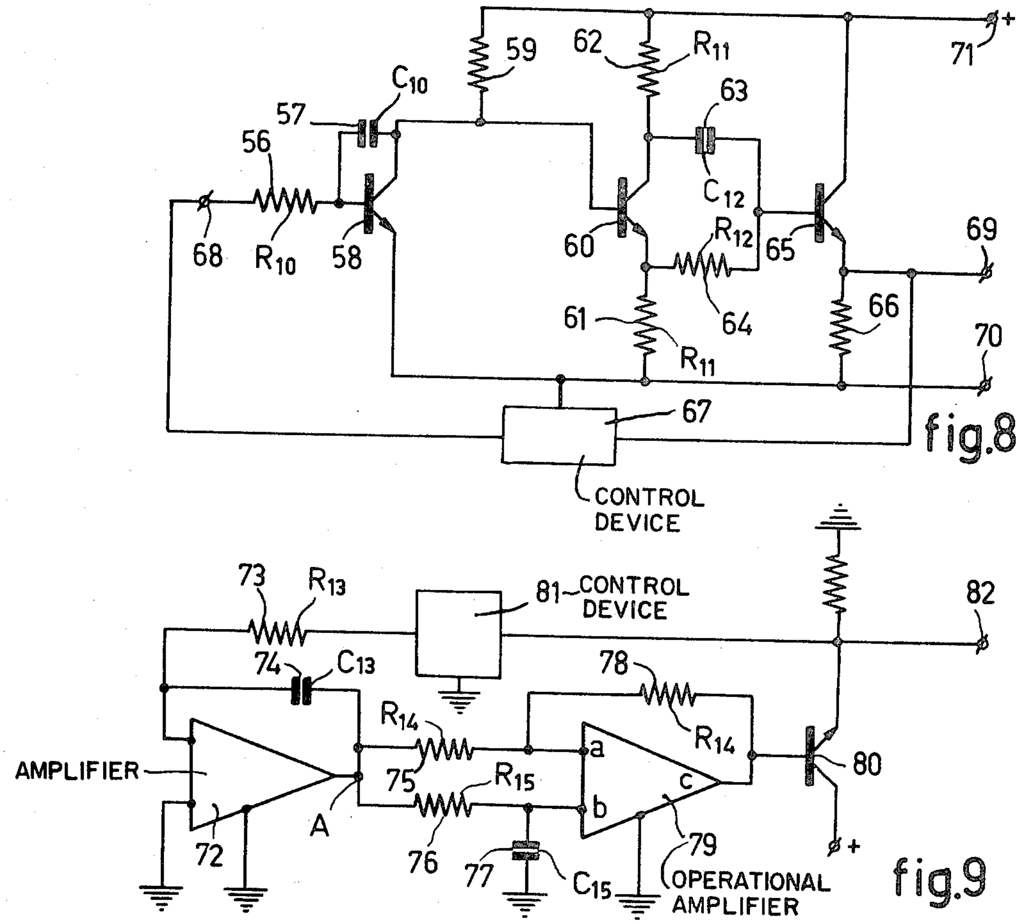
FIG. 8 shows another embodiment of the oscillator.
FIG. 9 shows an oscillator according to the invention using operational amplifiers.

FIGS. 7 and 8 show detailed circuit diagrams of the oscillator of FIG. 1 in which the circuits shown in FIGS. 2, 5 and 6 are used.

In FIG. 7 a resistor 44, a capacitor 45 and an amplifier 46 constitute the Miller integrator providing a frequency-independent phase shift of +90°, and resistors 47 and 50 together with an amplifier 51 constitute the phase inverter to which the second phase-shifting network comprising a resistor 48 and a capacitor 49 is connected. At the junction of $R_9$ and $C_9$ a signal is obtained which has a phase shift of −90° with respect to the signal at $R_8$, $C_9$.

This signal is offered to an emitter follower 52, the emitter terminal 53 of which is the oscillator output terminal, and appears at a terminal 55 with the correct phase for sustaining oscillation. In order to supervise the amplitude condition for oscillation or to additionally stabilize the output signal at the terminal 53 a control device 54 is included in the feedback lead from 53 to 55. Such a control device may maintain the amplitude of the oscillator signal constant by means of voltage-dependent resistors or resistance dividers, which may be reverse-biased diodes or zener diodes. Furthermore, the power of the oscillator signal which is converted into heat may cause resistance variations in resistors having positive or negative temperature coefficients which are included in the amplifiers or in the feedback path of the oscillator circuit. Thus, the amplitude condition for sustaining oscillation can be satisfied.

When a small percentage of distortion of the oscillator output signal is required and the output signal has to be constant in amplitude within narrow limits, a control circuit having the following functions is preferred: the output signal of the oscillator is rectified, smoothed and, in the form of a direct voltage, compared in a comparison circuit with a reference voltage supplied, for example, by a zener diode. The amplified difference signal is used to influence elements in the oscillator circuit which control the loop amplification, resulting in a control of the oscillator signal amplitude within narrow limits which are determined by the elements of the control circuit described. Instead of the above-mentioned circuit elements having variable voltage, current or resistance characteristics a photosensitive resistor irradiated by a light source may be used. The light source is fed with the amplified difference signal of the reference voltage and the oscillator voltage, and the photosensitive resistor may form part of the resistor pertaining to the Miller integrator, i.e., $R_7$ in FIG. 7, $R_{10}$ in FIG. 8 or $R_{13}$ in FIG. 9. Since the amplitude of the Miller integrator varies with $\omega RC$, the photosensitive element permits of ensuring that $\omega R$ remains constant and hence the amplitude remains constant, the phase condition of 90° still being satisfied if $\omega RCA$ is much greater than unity (where A = the amplification).

In FIG. 8 the Miller integrator 56, 57, 58 comprising a resistor $R_{10}$, a capacitor $C_{10}$ and a transistor 58 is connected to a phase inverter 60, 61, 62 to which is connected, at the collector resistor 62 and the emitter resistor 61, a second phase-shifting network 63, 64 comprising a capacitor $C_{12}$ and a resistor $R_{12}$. To an emitter resistor 66 of an emitter follower 65 is connected an output terminal 69 for the oscillator signal. Feedback is provided between the terminal 69 and a terminal 68, the feedback loop including the above-mentioned control device for the stabilization of oscillation and amplitude, which here is designated by 67.

FIG. 9 shows an oscillator including a Miller integrator which comprises a resistor 73, a capacitor 74 and an amplifier 72, and a particular embodiment of the phase inverter including a second phase-shifting network. For this purpose an operational amplifier or difference amplifier 79 is used. Such an amplifier has known properties, for example its input impedance is high, and only difference voltages between the inputs *a* and *b* are amplified and appear at the output *c*.

A second phase-shifting network comprising a resistor 76 and a capacitor 77 is connected between a point A at which the oscillator signal appears and the common lead of the oscillator, for example earth. The junction of the two impedances is connected to the input *b* of the amplifier 79. A feedback resistor 78 of value $R_{14}$ is connected between the output *c* and the input *a*, and the input *a* is also connected to the point A through a resistor 75 having the same value $R_{14}$. The signal at the output *c* has the same amplitude as the signal at the point A, but its phase angle depends on $\omega R_{15}C_{15}$. When the latter expression is equal to unity the angle is 90° so that in conjunction with the phase shift produced by the first phase-shifting network the phase oscillation condition is satisfied.

The advantage of the circuit arrangement is that the variable impedance, which in FIG. 9 is represented by the capacitor 77, can have one of its terminals connected to the common lead, for example to earth.

The oscillator signal at the output *c* of the amplifier 79 is offered to an emitter follower comprising a transistor 80 and appears at an output 82.

Feedback is provided from the output 82 through a control device 81 to the resistor 73 of the Miller integrator.

FIGS. 7, 8 and 9 clearly show that an embodiment of the oscillator in integrated-circuit semiconductor technology can be simply realized, enabling the oscillator to form an integral unit with the transducer, i.e., the variable resistor $R_9$ or $R_{12}$ or the capacitor $C_9$, $C_{12}$ or $C_{15}$, so that a measuring value transducer is obtained which linearly converts its measuring value into the period of an oscillator signal and delivers this signal for further processing.

What is claimed is:

1. An oscillator for generating a signal having frequencies tuned by means of a single variable impedance comprising in series circuit arrangement, a first network for phase-shifting the oscillator signal substantially 90° independent of frequency, phase-inverting means connected to said first network for providing signals having 0° and 180° phase shifts, said phase-inverting means comprising a second phase-shifting network comprising impedances for phase-shifting the oscillator signal substantially an additional 90° depending on the frequency of said oscillator signal and the values of said impedances, one of said impedances being variable, one of said impedances having values proportional to frequencies of the oscillator signal, means to combine said impedances to produce said additional 90° phase shift, amplifier means in said series circuit, and means for feeding the output of said second phase-shifting network back to said first phase-shifting network to maintain said oscillator signal.

2. An oscillator as claimed in claim 1 wherein said first phase-shifting network operates with said amplifier to form a Miller integrator, said phase inverting means comprises two equal resistors and an amplifier, the one resistor functioning as an input resistor to said amplifier, the other providing feedback means between the input and output of said amplifier, and said impedances comprise a series resistor and a parallel capacitor.

3. An oscillator as claimed in claim 1 wherein said first phase-shifting network operates with said amplifier to form a Miller integrator, said phase inverting means comprises a transistor having equal collector and emitter resistors, an in phase component of the oscillator signal being set up at one end of the resistor and an opposite phase component being set up from one end of the other resistor, and said impedances comprise resistive and reactive components in parallel.

4 An oscillator as claimed in claim 1 wherein said first phase-shifting network operates with said amplifier to form a Miller integrator, said phase-inverting means comprises two equal resistors and an operational amplifier, the one resistor functioning as an input resistor to said amplifier, the other providing feedback means between the input and output of said amplifier and said impedances comprise a series resistor and a parallel capacitor connected between the input to said inverting means and the common terminal of said operational amplifier.

5. An oscillator as claimed in claim 1 wherein said first phase-shifting network comprises a series resistor and a parallel capacitor.

6. An oscillator as claimed in claim 1 wherein said phase-inverting means comprise a transformer having a primary winding for receiving said oscillator signal, and a secondary winding provided with a center tap.

* * * * *

PO-1050
(5/69)

UNITED STATES PATENT OFFICE
CERTIFICATE OF CORRECTION

Patent No. 3,639,859 Dated February 1, 1972

Inventor(s) WILHELMUS A. J. M. ZWLISEN

It is certified that error appears in the above-identified patent and that said Letters Patent are hereby corrected as shown below:

Column 1, line 19, change "$\omega^2 RR_1C_1 \cdot R_{22} = 1$" to --$\omega^2 R_1C_1 \cdot R_2R_2 = 1$--.

Column 2, line 22, change "$\omega C_R$" to --$\omega L=R$--; change "$Z_2 = \omega L$" to --$Z_2$ or $Z_1 = \omega L$--.

Signed and sealed this 11th day of July 1972.

(SEAL)
Attest:

EDWARD M.FLETCHER,JR.
Attesting Officer

ROBERT GOTTSCHALK
Commissioner of Patents

PO-1050
(5/69)

UNITED STATES PATENT OFFICE

CERTIFICATE OF CORRECTION

Patent No. 3,639,859 Dated February 1, 1972

Inventor(s) WILHELMUS A. J. M. ZWIJSEN

It is certified that error appears in the above-identified patent and that said Letters Patent are hereby corrected as shown below:

On the title page, please correct the spelling of the inventors name from "ZWLISEN" to --ZWIJSEN--.

Signed and sealed this 13th day of February 1973.

(SEAL)
Attest:

EDWARD M.FLETCHER,JR.
Attesting Officer

ROBERT GOTTSCHALK
Commissioner of Patents